US010862406B2

(12) United States Patent
Behdinan et al.

(10) Patent No.: US 10,862,406 B2
(45) Date of Patent: Dec. 8, 2020

(54) HYBRID ELECTROACTIVE ACTUATOR DEVICE

(71) Applicants: Kamran Behdinan, Toronto (CA); Badr Aloufi, Toronto (CA)

(72) Inventors: Kamran Behdinan, Toronto (CA); Badr Aloufi, Toronto (CA)

( * ) Notice: Subject to any disclaimer, the term of this patent is extended or adjusted under 35 U.S.C. 154(b) by 460 days.

(21) Appl. No.: 15/889,770

(22) Filed: Feb. 6, 2018

(65) Prior Publication Data
US 2018/0226903 A1 Aug. 9, 2018

Related U.S. Application Data

(60) Provisional application No. 62/455,909, filed on Feb. 7, 2017.

(51) Int. Cl.
| | |
|---|---|
| *H01L 41/09* | (2006.01) |
| *H01L 41/113* | (2006.01) |
| *H01L 41/053* | (2006.01) |
| *H02N 2/04* | (2006.01) |
| *H02N 2/00* | (2006.01) |

(52) U.S. Cl.
CPC ......... *H02N 2/043* (2013.01); *H01L 41/0536* (2013.01); *H01L 41/096* (2013.01); *H01L 41/0946* (2013.01); *H02N 2/006* (2013.01)

(58) Field of Classification Search
CPC .... H02N 2/041; H02N 2/006; H01L 41/0536; H01L 41/0946; H01L 41/096

USPC .... 310/323.01, 323.02, 323.17–323.19, 328, 310/367, 369, 371, 324, 339, 348, 310/353–356

See application file for complete search history.

(56) References Cited

U.S. PATENT DOCUMENTS

| | | | | |
|---|---|---|---|---|
| 7,439,657 B2* | 10/2008 | Clingman | ........... | H01L 41/1134 310/332 |
| 8,400,046 B2* | 3/2013 | Hayamizu | ................ | B62M 3/08 310/332 |
| 8,937,424 B2* | 1/2015 | Griffin | ................... | H02N 2/043 310/328 |
| 2006/0119224 A1* | 6/2006 | Keolian | ................ | H01L 41/113 310/339 |

* cited by examiner

*Primary Examiner* — Thomas M Dougherty
(74) *Attorney, Agent, or Firm* — Nasser Ashgriz; UIPatent Inc.

(57) ABSTRACT

The present invention is a novel electroactive actuator device provides high active and passive performances for electromechanical and smart systems. The electroactive actuator device is capable of operating in a manner that achieve good passive isolation characteristics, amplifies the stroke displacement per applied voltage, and also enhances the active forces of the electroactive mechanism without weight or size penalties. The electromechanical responses can be transferred to the objective systems using lightweight electrical-mechanical connectors fastened at the center of the piezoelectric actuator elements. When an alternating voltage potential is across the upper and lower electrodes of a piezoelectric actuator element, the center portions of all the piezoelectric actuator elements, as well as the electrical-mechanical connectors attached thereto, reciprocate harmoniously in one direction generating high electroactive forces and dynamic responses.

20 Claims, 10 Drawing Sheets

HYBRID ELECTROACTIVE ACTUATOR DEVICE

RELATED APPLICATION

The present application claims priority to the U.S. Provisional Patent Application No. 62/455,909, filed on Feb. 7, 2017.

FIELD OF THE INVENTION

The present invention generally relates to electromechanical actuator devices and motors, and more particularly to electroactive actuators including piezoelectric actuator elements arranged in a manner or within a motor housing which in particular are adapted to generate high efficiency electromechanical energy and motion with single or multi degree of freedom.

BACKGROUND OF THE INVENTION

The development of an electroactive actuator with high active and passive performances is desirable in many smart structural applications, and has been attracted the attention of numerous researchers and engineers in the last decades. Nowadays, actuator technology has been intensely involved in all the fields of industrial applications for supplying forces and dynamics. Consequently, a large variety of actuators with different configurations, mechanical and electrical properties, and implementations have been developed and commercially marketed.

Generally, the input energy to an actuator is either hydraulic, pneumatic, thermal or electrical, while the output is typically mechanical work. Although hydraulic and pneumatic actuators can apply ultra-high actuating forces and displacements, they cause incredible increase in mass and space to the overall system. In addition, hydraulic actuators as well as pneumatic and thermal actuators are usually limited to very low-frequency and low-accuracy systems.

Electrodynamic actuators are normally composed of heavy magnetic components and long metallic coils. Thus, inductive heating and significant loss in energy may occur due to the electrical resistance of the electromagnetic coils. However, in the last decades, a new class of actuators using smart materials can provide alternative solutions for achieving high energy efficiency, light-weight, small, and cost saving systems. The piezoelectric actuators, for instance, can generate about 10 times more energy per mass and 100 to 1000 times more work per volume than that of electromagnetic or hydraulic actuators.

There are a number of actuators using different types of smart materials in the applications of structural vibration, motion and control systems, including, for example, piezoelectric actuators, piezo-magnetic actuators, shape-memory alloy (SMA) actuators, magnetostrictive actuators, piezoactive polymer actuators, etc. However, the actuators that most widely used nowadays are piezoelectric actuators due to the fact that they can produce high levels of forces and fast dynamic responses without significant disadvantages in terms of mass, size or electrical consumption. Thus, a large number of designs of piezoelectric actuators are reviewed in many literatures, which can be generally categorized as direct or indirect piezoelectric actuators.

A typical direct piezoactuator, such as a PZT (Lead Zirconate Titanate) patch or rod, is widely used to generate mechanical energy or motion without integrating with an external structure. In general, direct actuators are constructed by means of a single layer of piezoelectric material sandwiched by a pair of electrodes. They are principally a mechanical work generator, or motor, since a direct piezoelectric actuator is capable of generating a force and displacement, when it is activated, and therefore doing a mechanical work. However, direct actuators suffer from being not able to satisfy the demands of most industrial applications, which require higher actuating displacement, due to the fact that the free strains of a natural piezoelectric material are extremely small, on the order of 0.1% to 0.2% of the material size. In the last two decades, a significant effort has been directed towards the development of mechanisms that can indirectly enlarge the output displacements of direct actuators enough to be applicable in industrial fields.

The basis for indirect actuation devices is that a greater displacement can be achieved using an amplification system including one or more direct actuators in order to magnify their dimensional changes. There are various types of indirect actuation devices already presented in a wide number of patents and papers. Basically, they can be grouped into three main categories: externally leveraged, frequency leveraged, and internally leveraged actuators, which can be either applied independently or combined together.

Externally leveraged actuators use external amplification mechanisms (e.g. a lever arm, a hydraulic mechanism, or a flextensional mechanism) to increase the actuating displacement response. The external mechanisms are usually complex structures that contribute significantly to the overall weight and dimensions. Frequency leveraged actuators can generate linear or rotational motions relying on friction and pressure of contacting surfaces between piezoelectric elements and external structures, e.g. inchworm motors and ultrasonic actuators. Frequency leveraged actuators are able to produce unlimited displacement using a number of actuator elements moving rapidly in one direction but with different phase shifts. However, the overall frequency response is very slow and their applications are usually limited to light and multi-axis positioning systems. Internally leveraged actuators, in contrast to externally leveraged actuators, use internal structure components to generate relatively high actuating displacements instead of external mechanisms.

A typical internally leveraged actuator utilizes either a bending mechanism, such as bi-morph bending cantilevers and uni-morph bowing actuators, or parallel expansion/contraction mechanism, such as stack actuators.

Stack actuators are generally constructed by means of multiple layers of piezoelectric materials sandwiched by pairs of electrodes and bonded to each other using adhesive materials. A typical stack actuator can be applied independently or integrated with external amplified mechanism as a source of force. The improvement of this type of actuator is usually obtained by stacking a sufficiently large number of piezoelectric layers in opposite polarization directions, which change their dimensions (i.e. expansion or contraction) simultaneously, in order to increase the total strain. The other category of internally leveraged actuation devices uses one or more piezoelectric patches. This type of device can be either constructed as a unimorph actuator by bonding a single piezoelectric layer to a flexible passive layer or as a bimorph actuator using a double layer of piezoelectric patches attached to each other or to a passive layer between them. When the piezoelectric patches are active, high shear stresses are generated between the bonded layers creating an internal bending moment along the actuator and thereby high deflection. Although unimorph and bimorph actuators are capable of providing ultra-high displacement and better passive isolation with minor size and mass penalties in comparison with externally leveraged actuators, the output actuating force is generally weaker and, in some applications, not sufficient.

Thus, new classes of unimorph actuators, known as "mechanically pre-stressed internally leveraged bending actuators", such as RAINBOW, CERAMBOW, CRESCENT, C-block, and THUNDER, have recently been introduced in many publications to enhance the dynamic response and mechanical load capability.

The THUNDER (thin-layer composite-unimorph ferroelectric driver and sensor) actuator was developed by the NASA Langley Research Center (LaRC) in 1994 as a new actuator technology offering high output displacement and improved loading force capabilities. A typical THUNDER actuator is composed of a piezoceramic wafer (e.g., PZT-5H or PZT-5A) bonded under high temperature and pressure to a relatively thick metallic backing sheet (e.g., aluminum, copper, or stainless steel) and an upper thin sheet of metal acting as an electrode using a LaRC-SI adhesive layer. Then, the composite structure is progressively cooled down to ambient temperature. During the cooling process, the adhesive layers solidify at around 270° C., creating pre-stressed conditions in the bonded layers due to the effect of the thermal expansion coefficients, and thereby an out-of-plane curvature. Thus, the final radius of curvature of the actuator, when inactivated, depends only on the amplitude of the ambient temperature. Since the Curie points of PZT-5H and PZT-5A are around 195° C. and 365° C., respectively, some loss of polarization may occur in the piezoelectric layer. Therefore, a re-poling process must follow the cooling phase by subjecting the actuator to a high DC voltage along its thickness.

Practically, activating the piezoelectric layer generates out-of-plane flexural vibrations in the THUNDER actuator. As the piezoelectric material is activated by positive and negative voltages, in-plane expansions and contractions in direction 1 are produced in the piezoelectric layer causing an in-plane compression/tension stress field on the surface of the backing sheet, and thereby out-of-plane vibrations in the actuator. The thin curved metallic backing layer, which supports the composite layers, provides high bending flexibility to the structure, and thereby increases the mechanical insulation coefficient of the actuator. In addition to its passive performance, the pre-stressed characteristic and curved shape of the actuator improve the active strain and loading force performances relative to conventional unimorph and bimorph actuators.

Due to the high electrical and mechanical performances of the mechanically pre-stressed internally leveraged bending actuators, particularly THUNDER actuator elements, a number of actuator apparatus and motors using this class of actuators have been presented many patents and papers. The simulation of a simple four-degrees-of-freedom model with active actuators and experimental investigations for active vibration isolation design of a vehicle seat and passenger using THUNDER actuator elements was addressed by M. Malowicki and D. J. Leo. In the same field of study, J. P. Marouzand and L. Cheng discussed the active-passive effects of THUNDER actuators by predicting and testing the active and passive vibration isolation performance of a single-degree-of-freedom (SDOF) system. However, these studies focused generally on the feasibility of improving the vibration isolation of a system by applying active THUNDER actuators without attempting to enhance the actuator priorities. Similarly to stacked actuators, the electromechanical properties of the internally leveraged bending actuators, such as THUNDER actuators, can be amplified by integrating one or more actuator elements within external amplification mechanisms.

Although amplification mechanisms of stacked actuators have been widely presented in numerous patents and papers, the devolvement of amplification mechanical devices involved in using for the class of curved-shape actuator elements is very few. Because of the curvature and out-of-plane deformation of these actuators, the design of an appropriate mechanism is far from simplicity. In the design of the actuator device, the curved-shape actuators, for example THUNDER elements, can generally be mounted by two methods using either: (a) a hard supporting mechanism applied to only one tab so that it behaves as a cantilevered beam; or (b) a soft supporting mechanism at both tabs to make the actuator acts as a spring-supported beam with very soft spring stiffness. The cantilever mounting method, in fact, requires a simpler mechanism since one of the tabs is fixed and the other deforms freely. Also, this method can extremely improve the actuating displacement performance. However, the output forces that can be produced are very weak and, in many cases, insufficient for some applications. In order to achieve a more practical actuator design providing high active loading capability and dynamic response, the second supporting method must be considered.

It was demonstrated that the actuating force can be maximized by stacking more piezoelectric elements, but the increase in piezoelectric elements decreases the actuator dynamic response and passive isolation performance. Also, since the ends of the piezoelectric elements are either connected to rotational joints or received in slots, which are located in side mounts sliding on the actuator housing structure, high friction may occur on the sliding and rotating surfaces, particularly at high vibrational frequencies. The use of this design of amplification mechanism is therefore limited to low-frequency applications. Thus, this invention presents an improvement of a novel piezoelectric actuator has the ability of developing and controlling its output work to achieve optimal active and passive performances.

SUMMARY OF THE INVENTION

It is the object of the present invention to develop an electroactive actuator device with the capability of providing simultaneous passive isolation and active electromechanical generation in smart systems, such that the electroactive actuator device may be applied effectively in coupled active and passive control systems and many other applications, such as active structural acoustic control (ASAC) systems, electroactive mounts, electromechanical motors, and multi-degree-of-freedom parallel platform mechanisms. In general, the dynamic flexibility, actuating force and displacement capabilities, size, weight, ease of installation and ease of fabrication are the most important factors in the development of a multi-application actuator system. To achieve these and other objects and advantages, the present invention presents and describes improved electroactive actuator devices that may be used individually or in tandem to form different electroactive mechanisms with single or multiple degrees of motion.

An individual electroactive actuator device of the present invention comprises one pair of pre-stressed piezoelectric actuator elements, such as THUNDER, in which they are mounted in opposite each other using two support mechanisms to supply the actuator device with sufficient electroactive energy. A typical piezoelectric actuator element is generally divided into three sections: two tabs at the ends and a piezoelectric section in the center. Each tab remains flat since it consists of only one inactive metallic layer, by which the support mechanisms hold the piezoelectric actuator elements at their tabs. The piezoelectric section is curved with a dome because of the mechanical pre-stressing effect of the piezoceramic and metallic backing layers. However, the dome height of the curvature of the piezoelectric element is just a few milli-inches, which is very small for some applications. Thus, the support mechanisms play a role in both the installation of the piezoelectric elements, and in adjusting the device length to achieve the desirable length.

Each one of the two support mechanisms consists of a rigid linkage connected to two grippers with gripping mechanisms through elastically fixable hinges at the corners. Each gripping mechanism grasps one of the tabs of the piezoelectric element and is tightened via screws. This mechanism allows each of the piezoelectric elements, when activated, to deform as a curved beam supported by springs with controllable stiffness, in which the springs stiffnesses affects the output actuator responses. Thus, in case of actuator design, the flexible hinges are critical members in the support mechanism because their configuration significantly influences the passive and active performances of the electroactive actuator device. In general, the hinge mechanism behaves as translational and rotational (in-plane) springs at the actuator corners, with stiffnesses depending on the dimensions and configurations of the hinges, such as thickness, radius and opening angle. Electrical-mechanical connectors are mounted on the centers of the piezoelectric elements to connect the actuator device with other mechanical systems and thus transfer the output mechanical force and displacement of the actuator device to those systems.

In accordance with further embodiments of the present invention, the electroactive actuator device may comprise more than one pair of piezoelectric actuator elements to form different configurations and models of actuator devices. The configuration of an actuator device may be in the form of dual- or quad-support mechanisms with different numbers and arrangements of piezoelectric elements to improve the actuating force and displacement. A typical actuator with dual-support mechanisms may comprise two piezoelectric actuator elements, as described above, or four piezoelectric actuator elements, as shown in FIG. 7, while actuators with quad-support mechanisms preferably include eight piezoelectric actuator elements arranged in the manner shown in FIG. 8.

A further embodiment of the present invention involves a pair of electroactive actuator devices structurally connected to form a new model of an electroactive actuator device, but with amplified active force generation, as shown in FIG. 5. The two or more interconnected piezoelectric elements in one of the described actuator configurations may be arranged in series, in parallel and/or in stacks. In the preferred embodiment described herein, a plurality of electroactive actuator devices may be interconnected either in series or in parallel inside a motor housing, with a piston providing extra high actuating power. A further embodiment of a parallel platform mechanism with multiple degrees of freedom may be configured using symmetrical groups of three or more electroactive actuator devices connected to a fixed base and movable platform, such as a tripod, quadripod, and hexapod platforms.

DETAILED DESCRIPTION OF THE INVENTION

Figure 1:
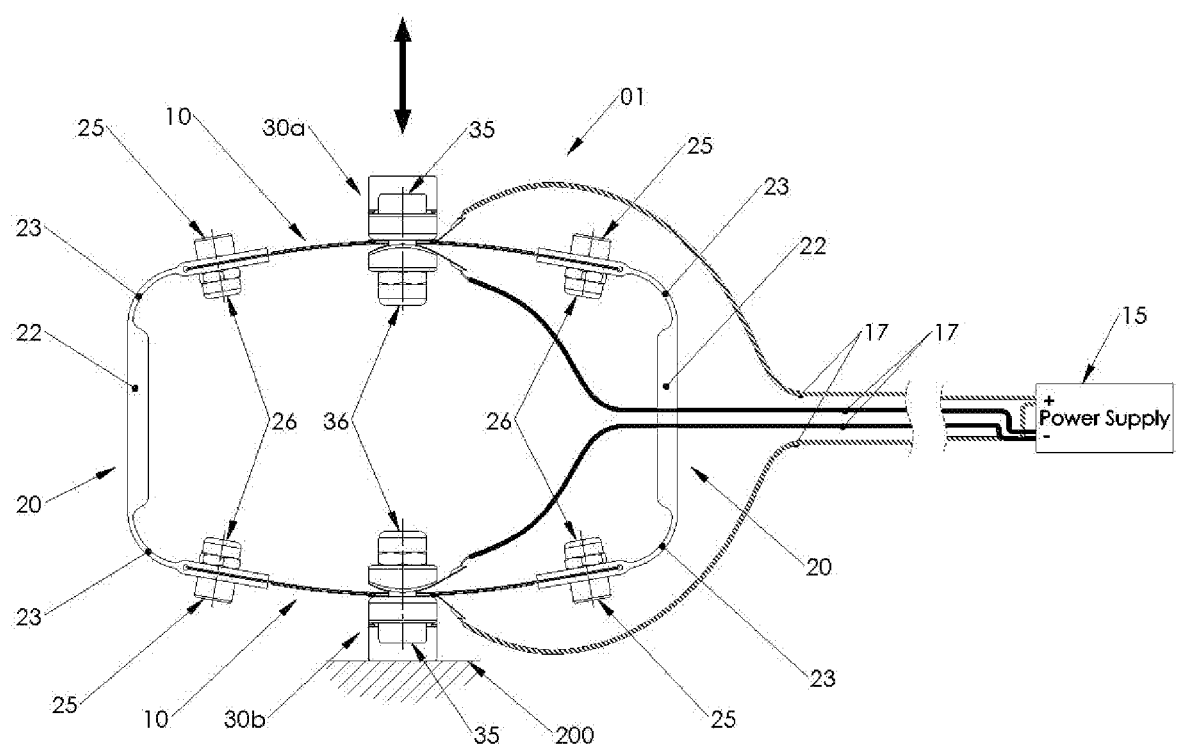
FIG. 1 schematically shows an electroactive actuator device with a pair of piezoelectric elements mounted opposite each other mechanically by two support mechanisms and electrically connected to a power supply via wires.
Figure 2:
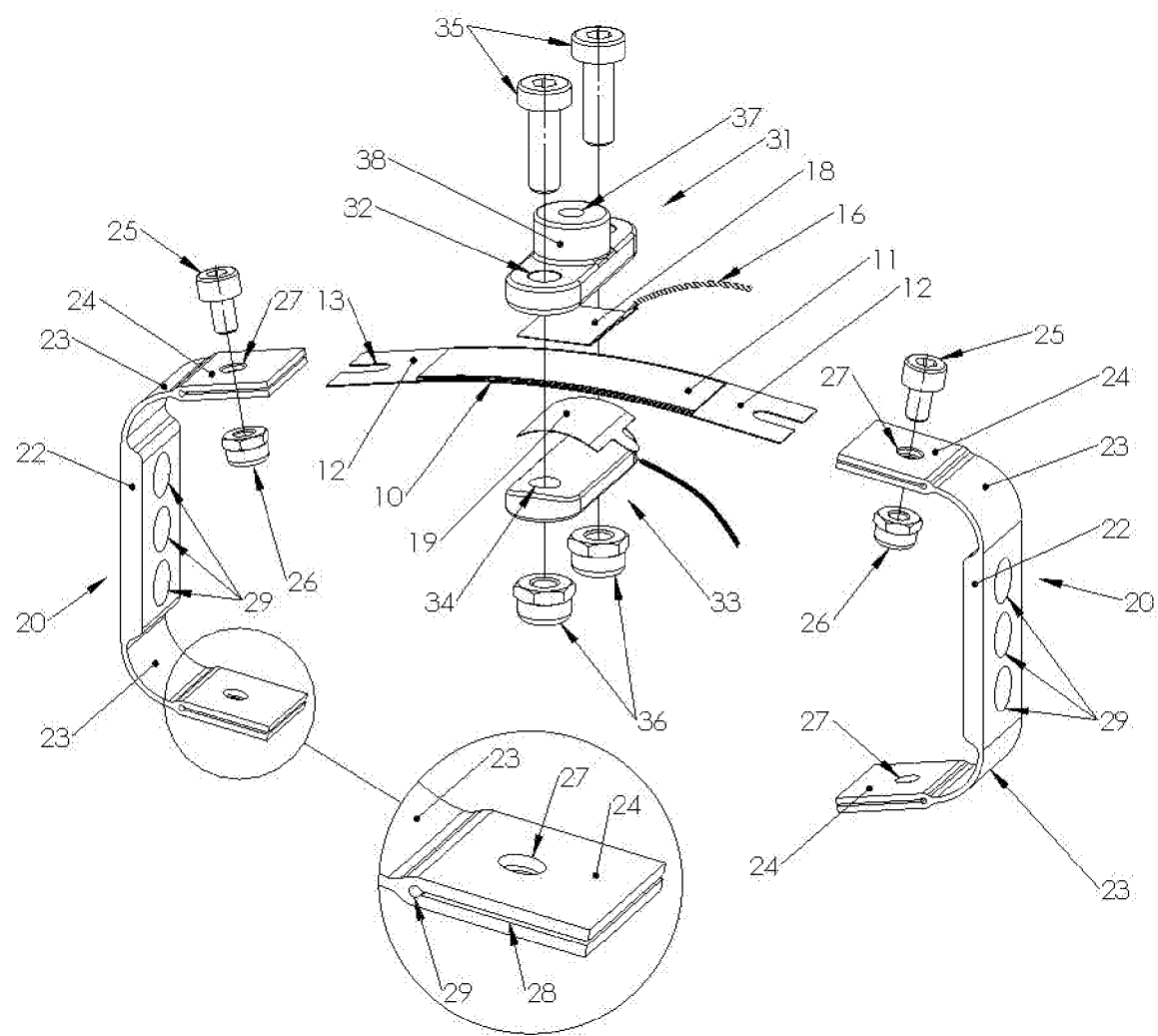
FIG. 2 schematically shows an exploded view of an electroactive actuator device, in which a piezoelectric actuator element sandwiched at the center between two contacting elements and electrical film conductors, and coupled to two support mechanisms at the ends.
Figure 10:
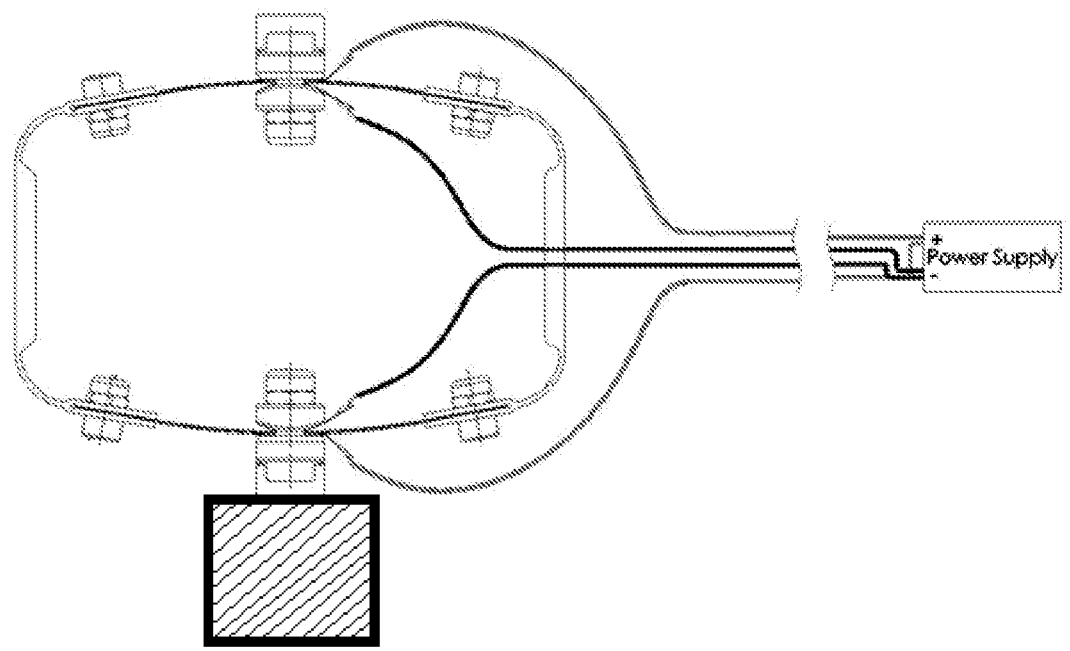
FIG. 10 shows a photograph of a fabricated electroactive actuator device under testing using a pair of piezoelectric elements electrically connected to a power supply by four wires according to the invention.

With reference to FIG. 1, FIG. 2 and FIG. 10, the electroactive actuator 01 comprises electrically a pair of piezoelectric elements 10 for generating electroactive work for the actuator, mechanically two support members 20 mounting the piezoelectric elements 10 in the form of facing opposite each other, and uppermost and lowermost electrical-mechanical connectors 30a and 30b, which are utilized to transfer the mechanical and electrical loads both from and to the electroactive actuator 01. In general, the piezoelectric element 10 (sometimes referred to as a THUNDER element) comprises an piezo-active portion 11 located in the center and two non-active portions, called tabs, 12 on either end of the piezoelectric element 10, as illustrated in FIG. 2. The piezo-active portion 11 is composed of multiple layers of different materials (piezoceramic layer, metallic backing and upper electrode) bonded under high pressure and temperature by means of adhesive. Thus, at room pressure and temperature, this part curves because of the mechanical pre-stressing of the piezoceramic and metallic backing layers. The two tabs 12 are inactive and remain flat at room pressure and temperature since each one consists of only one metallic layer. Each tab includes one or more slots 13 for attaching to and supporting the piezoelectric elements 10 with support mechanisms 20.

The support mechanisms 20 play a role not only in the installation of the piezoelectric elements, but also in controlling the device length. Each support mechanism 20 is a constructed of five mechanical members, a rigid linkage 22, two elastically fixable hinges 23 and two grippers 24, arranged in the form of a C-shape. The rigid linkage 22 is a stiff and flat beam and connected to a curved fixable hinge 23 at each end. Each fixable hinge 23 is connected to a gripper 24 including a gripping mechanism with a narrow slot 28 ended by hole relief 29 (for ease of opening) to hold the tab portions 12 of the piezoelectric elements 10. The gripper face has a thru-hole 27 at the center for tightening the piezoelectric elements 10 with the support mechanism 20 by means of a screw 25 and nut 26 in the assembly, as shown in FIG. 2.

The piezoelectric elements 10 are thus connected to the rigid linkages 22 by the elastically fixable hinges 23. This mechanism allows the piezoelectric elements 10 to act as curved beams with highly flexible spring-supported conditions at the boundaries to vibrate with high electromechanical responses at the midpoints of the actuators. Thus, to control the flexibility of the piezoelectric element boundaries, the hinges 23 are designed as a thin curved shape. The fixable hinges 23 are characterized by three main parameters: thickness, radius and opening angle, which have great effects on the actuator properties. Thus, optimal output active static and dynamic responses and passive characteristics of the electroactive actuator 01 can be obtained by controlling these parameters. The rigid linkages 22 play an important role in coupling the piezoelectric elements 10 and adjusting the desirable actuator length. In comparison with the hinges 23, the linkages are designed to be flat and thicker. In some applications where the increase in weight is extremely undesirable, the linkages 22 may include through holes 29 on the face to decrease the actuator mass.

Rigid and lightweight electrical-mechanical connectors 30a and 30b are fastened at the center of the piezoelectric elements 10 to connect the electroactive actuator 01 with mechanical systems. Thus, the electromechanical energy generated by the electroactive actuator 01 is transmitted to the attached systems by means of the electrical-mechanical connectors 30a and 30b.

As shown in FIG. 2, each electrical-mechanical connector 30 comprises two unitary elements: an output-element 31 and a backing-element 33, sandwiching a piezoelectric element at the midpoint. The output-element 31 and backing-element 33 are made of non-conductive material, such as plastic or fiberglass, to avoid any electrical conduction between the actuator electrodes. The two connecting elements are linked and tightened to each other by means of two screws 35 and two nuts 36, which pass through the adjacent holes 32 and 34. The backing-element 33, which is attached to the concave face (lower electrode) of the piezoelectric element 10, has a curved face with a curvature higher than that of the piezoelectric element to make the attachment between the backing-element 33 and piezoelectric element 10 occur at a single point at the center. On the other hand, the contact face of the output-element 31 is flat because it is attached to the convex face (upper electrode) of the piezoelectric element 10.

The output-element 31 also includes a neck 38 mounted in the center of the top face of the output-element 31 with a tapped hole 37 for linking the electrical-mechanical connectors 30a and 30b to mechanical systems and thus transmitting the generated electromechanical power from the electroactive actuator 01 to the attached systems. Also, the electrical voltages applied to the piezoelectric elements 10 can be transferred into the actuator electrodes through the electrical-mechanical connectors 30a and 30b. Electrical voltages can be generated by a power supply 15 electrically connected to the electrical-mechanical connectors 30a and 30b via wires 17. The voltages are electrically transferred to the convex face (upper electrode) of the piezoelectric element 10 through the upper film conductors 18. The ends of the wires 17 are connected to the upper film conductors 18 bonded to the contact faces of both the output-element 31 by means of adhesive materials and attached to the convex face (upper electrode) of the piezoelectric element 10. The voltages are also electrically transferred to the concave face (lower electrode) of the piezoelectric element 10 through the lower film conductors 19.

The ends of the wires 17 are connected to the lower film conductors 19 bonded to the contact faces of both the backing-element 33 by means of adhesive materials and attached to the concave face (lower electrode) of the piezoelectric element 10. The lower film conductor 19 and upper film conductor 18 are electrically conductive materials which can be made of copper, brass or aluminum. The film conductors (18, 19) have two portions: an electrode contact portion and wire contact portion. The wires 17 are connected to the film conductors (18, 19) at the wire contact portions, which are the smaller parts of the conductor extended to the outside, using any method of electrical wire ends connection, such as soldering. The electrode contact portions are the larger parts of the conductors. They are located in the center of the contact face of the output- and backing elements (31, 33) and sandwiched between the elements of the electrical-mechanical connectors 30a and 30b and the piezoelectric elements 10 so as to be directly in contact with their electrodes. The contact portion of the lower film conductor 19 bonded to the backing-element 33 is curved, with a radius of curvature equal to that of the contact face of the backing-element 33 and a width equal to the width of the piezoelectric elements 10. However, the contact portion of the upper film conductor 18 bonded to the output-element 31 is flat, and has a width also equal to the width of the piezoelectric elements 10.

Activating the piezoelectric layer of a piezoelectric element 10 generates out-of-plane deformations of the element. As the piezoelectric material is activated by positive and negative voltages, in-plane expansions and contractions in direction 1 are produced in the piezoelectric layer, causing an in-plane compression/tension stress field on the contact surface between the piezoelectric layer and metallic backing layer, and out-of-plane deformation of the actuator element. The thin curved metallic backing layer, which supports the composite layers, provides high bending flexibility to the structure, and thereby increases the mechanical insulation coefficient of the actuator. In addition to its passive performance, the pre-stressed characteristic and curved shape of the actuator improve the active strain and loading force performances relative to conventional unimorph and bimorph actuators.

When an electrical voltage is generated from a power supply 15 to be applied to the piezoelectric elements 10 through the film conductors (18, 19), the curved piezoelectric elements 10 responsively deform in the form of increasing their curvature (in the direction of the center). As mentioned, the activated piezoelectric layer generates an in-plane tension stress field on the contact surface between the backing sheet and piezoelectric patch, and thereby an internal moment on the piezoelectric elements 10.

The high bending moment is generated at the boundaries and transmitted through the rigid grippers 24 to the fixable hinges 23, causing the fixable hinges 23 to bend in the form of decreasing their curvature (in the opposite direction of the center). Note that the bending effects of the grippers 24 and linkages 22 are practically nonexistent due to their higher bending rigidity. Therefore, the bending deformations of the actuator occur only in the piezoelectric elements 10 and hinges 23, because of their high flexibility. Furthermore, the directions of the bending deformations of both the piezoelectric elements 10 and hinges 23 are always opposite to each other. Due to the active deformation, in which the piezoelectric elements 10 become more curved and the hinges 23 become less curved, the midpoints of the uppermost and lowermost piezoelectric elements 10 will move vertically away from each other, and thereby push the electrical-mechanical connectors 30a and 30b away from each other. Note that, although the fixable hinges 23 play very important roles in providing soft spring-supported boundary conditions for the piezoelectric elements to be deformed approximately freely, the hinges 23 are deformed in a manner that increases the amplification of the output response of the actuator 01. In some applications, the lowermost electrical-mechanical connector 30b may be fixed on a rigid wall 200, while the topmost electrical-mechanical connector 30a is movable. Thus, the actuating responses of the actuator device are produced through only the uppermost electrical-mechanical connector 30a, and the output actuating displacement is measured from the uppermost connector relative to the lowermost connector.

When the applied electrical voltage is switched off, the piezoelectric layers of the piezoelectric elements 10 become electrically inactive, eliminating the in-plane tension stress on the contact surface of the backing sheet and the disappearance of the internal moment. As a result, both the piezoelectric elements and hinges tend to move back to their resting curvatures, so that the topmost and lowermost connectors 30a and 30b return to their initial locations. In opposition, when the power supply 15 electrically loads the piezoelectric elements 10 with an opposite voltage through the film conductors (18, 19), the curved piezoelectric elements 10 bend in a direction away from their center to form further curves having lower curvatures.

This means that, if the piezoelectric layer is activated by an opposite electrical voltage, the piezoelectric layer will contract generating an in-plane compression stress field on the contact surface of the backing sheet, and thereby an opposite internal moment. Similarly, the resulting moment is thereby transmitted through the rigid grippers 24 to the fixable hinges 23, but causing the fixable hinges 23 to bend in the form of increasing their curvature (toward the center). Again, due to the opposite active deformations of the piezoelectric elements 10 and hinges 23, in which the piezoelectric elements 10 become less curved and the hinges 23 become more curved, the midpoints of the topmost and lowermost piezoelectric elements 10 will move vertically toward each other, and thereby pull inwardly the electrical-mechanical connectors 30a and 30b toward each other.

Figure 3A:
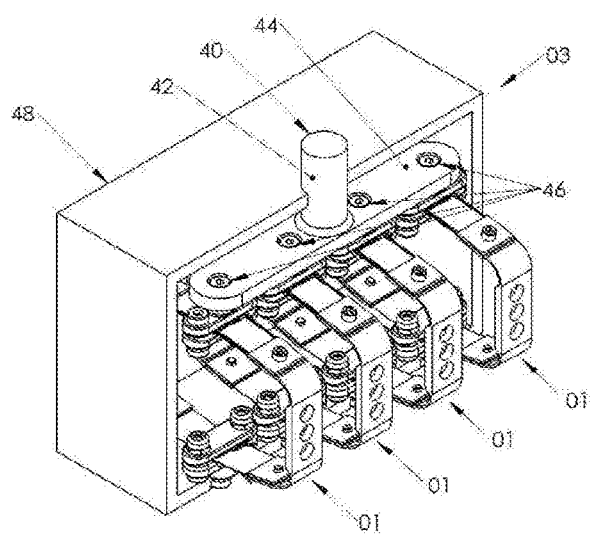
FIG. 3A schematically shows a perspective view of a tandem assembly of electroactive actuator devices arranged in parallel within a motor housing to form an actuator device according to a further embodiment of the invention.
Figure 3B:
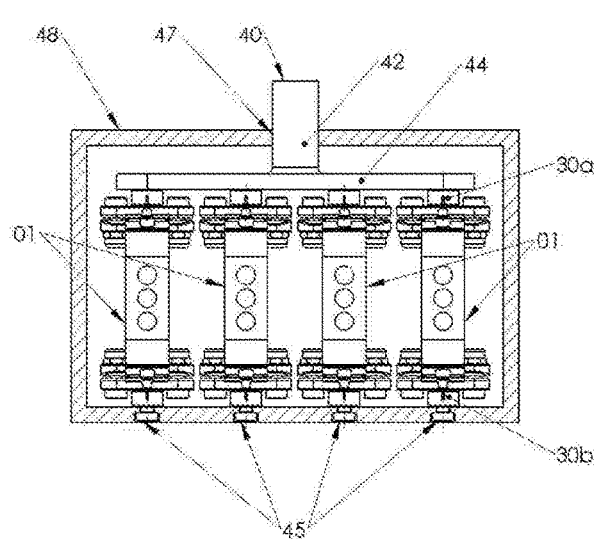
FIG. 3B schematically shows a cross-section view of a tandem assembly of electroactive actuator devices arranged in parallel within a motor housing to form an actuator device according to a further embodiment of the invention.

Referring now to FIGS. 3A and 3B, more than one electroactive actuator 01 may be used simultaneously in a mechanical device 03 in order to magnify the output electromechanical power by tandem-arranging the electroactive actuators 01 in parallel within a motor housing 48. This arrangement couples the output mechanical responses of the electroactive actuators 01 by means of a multi-coupling mount 40 to be worked as a piston with one degree of freedom. The multi-coupling mount 40, which is preferably made of an electrically non-conductive material, comprises two members: a connection plate 44 and piston 42. The uppermost connectors 30a of the electroactive actuators 01 are attached to the multi-coupling mount 40 at the connection plate 44 using screws 46 passing through the plate holes, while the lowermost actuator connectors 30b are fixed to the bottom wall of the motor housing 48 by screws 44. Thus, when the electroactive actuators 01 are electrically activated with an identical voltage, the uppermost connectors 30a will transfer the motion of the electroactive actuators 01 to the connection plate 44 and then to the piston 42 by pushing up and pulling down the piston 42 with the same displacement amplitude, but with an amplified mechanical force. The center of the piston 42 slides smoothly within a sliding hole 47 located in the top wall of the motor housing 48, so that the top side of the piston 42 moves freely outside the motor housing 48, and may be attached to another system to transfer the output mechanical motion to that system. Due to the high load-carrying capability, the electroactive device 03 may have the advantage to be used as an electroactive isolator, particularly for highly sensitive equipment.

Figure 4A:
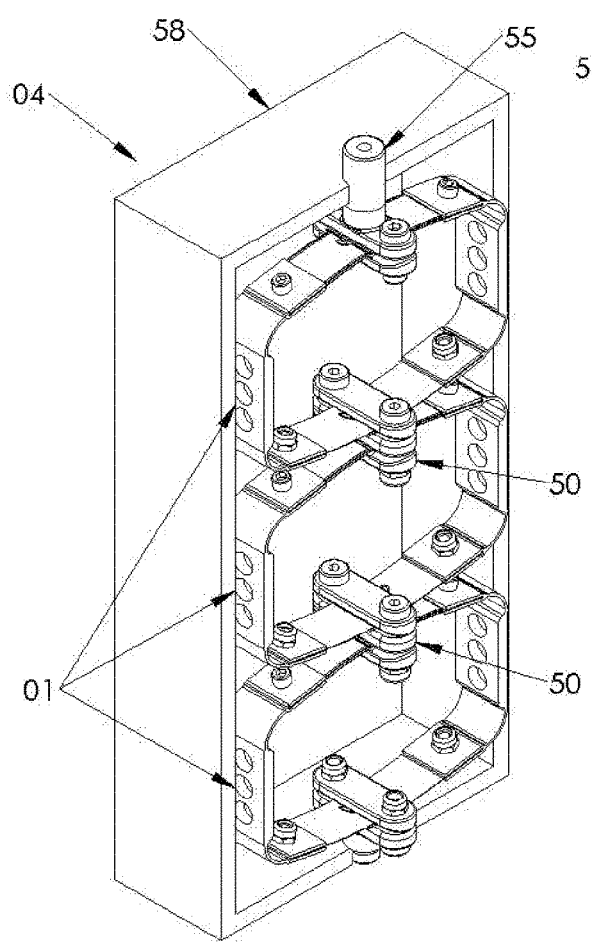
FIG. 4A schematically shows a perspective view of a stacking assembly of electroactive actuator devices arranged in series within a motor housing to form an actuator device according to a further embodiment of the invention.
Figure 4B:
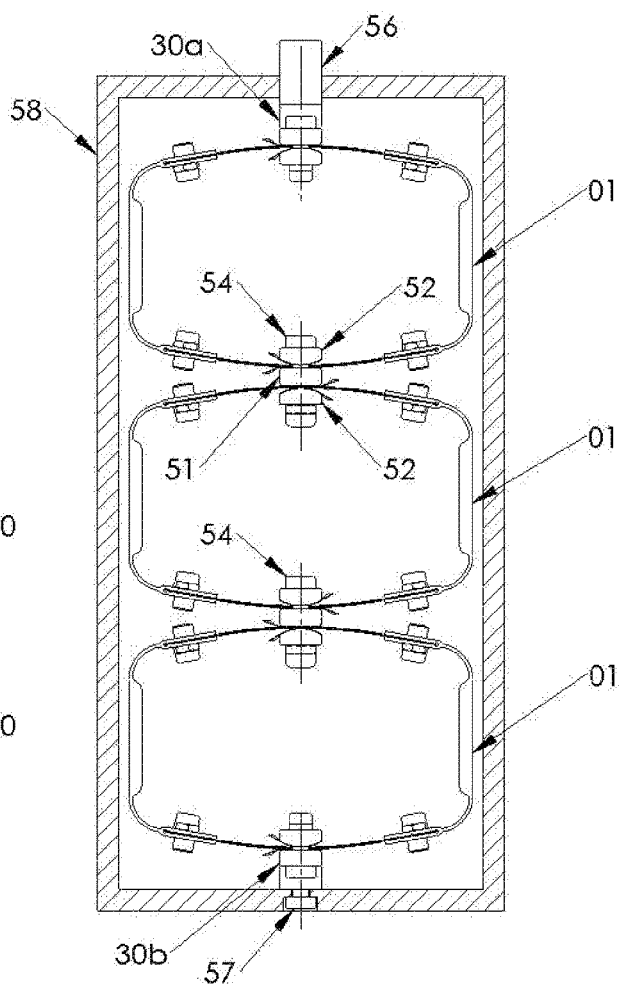
FIG. 4B schematically shows a cross-section view of a stacking assembly of electroactive actuator devices arranged in series within a motor housing to form an actuator device according to a further embodiment of the invention.

Referring now to FIGS. 4A and 4B, an embodiment of a further mechanical device 04 may be configured by stacking serially a plurality of electroactive actuators 01 and disposing them within a motor housing 58. The construction of each electroactive actuator 01 corresponds to that described in FIG. 1. Each electroactive actuator 01 is connected in series to next one by a midmost electrical-mechanical connector 50; however, the lowermost electrical-mechanical connector 30b of the first electroactive actuator 01 is rigidly fixed to the bottom wall of the motor housing 58 by a screw 57, while the uppermost electrical-mechanical connector 30a of the last electroactive actuator 01 is attached to a vertically free moving piston 56. Each midmost electrical-mechanical connector 50 is constructed of three non-conductive elements—two backing-elements 52 and one intermediate-element 51—and four electrical film conductors (18, 19), as illustrated in FIG. 2, bonded on the contact faces of the three elements. When these electrical film conductors (18, 19) are supplied with an electrical voltage, the stroke displacement of the output piston 56 of the electroactive device 04 will be highly amplified, relative to the output displacement of an individual electroactive actuator 01, due to the stacking-arrangement.

Figure 5:
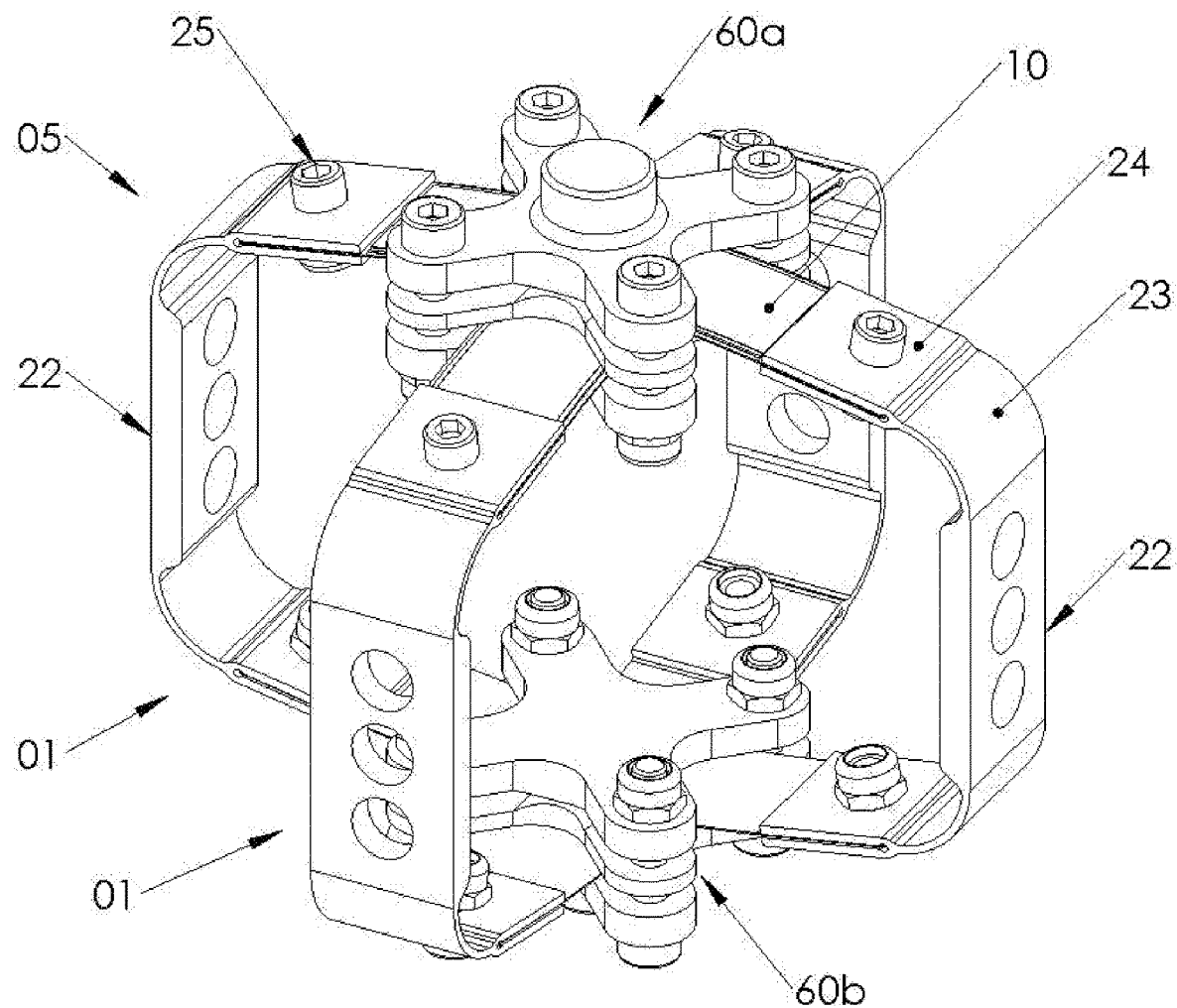
FIG. 5 schematically shows a perspective view of a structural configuration of a pair of electroactive actuator devices coupled at the intersection points of the piezoelectric elements to form a single electroactive actuator device with improved actuating responses according to a further embodiment of the invention.
Figure 6:
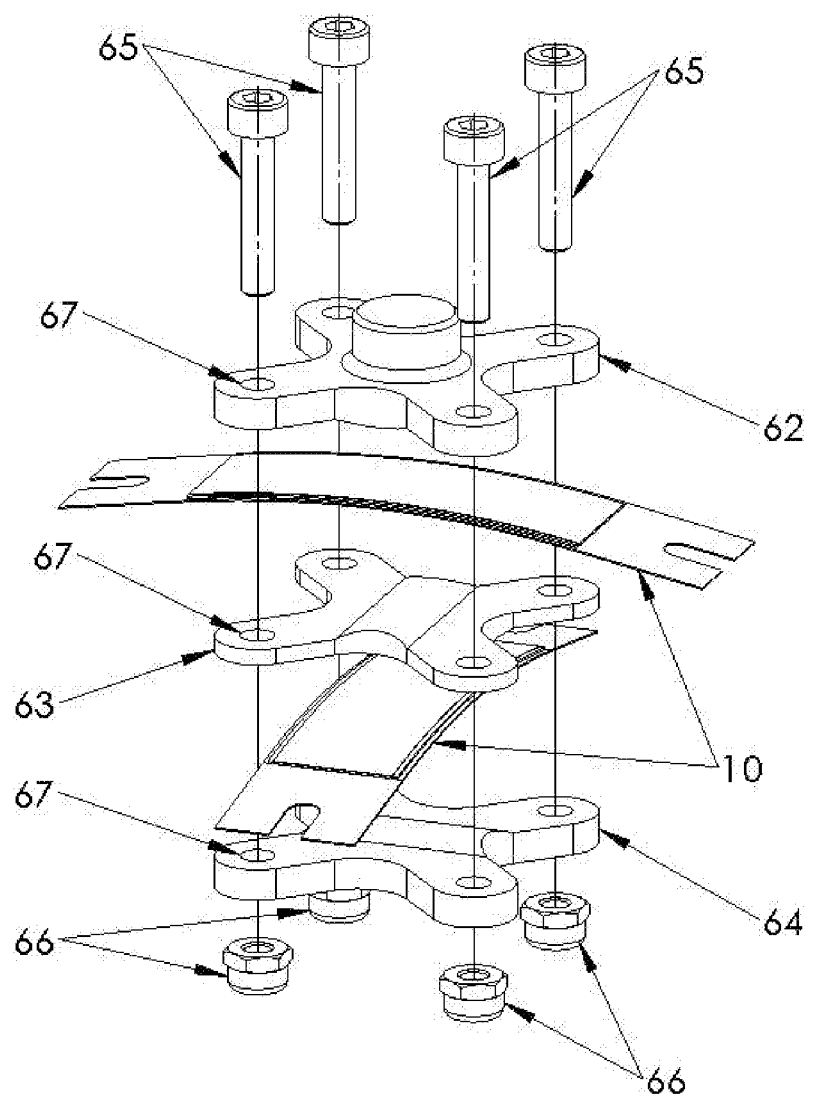
FIG. 6 schematically shows an exploded view of two piezoelectric actuator elements sandwiched between three contacting elements at the intersection of the piezoelectric elements.

Referring to FIG. 5 and FIG. 6, the figures illustrate a further embodiment constructed by coupling a pair of electroactive actuators 01 by means of intersecting and stacking their piezoelectric elements 10 to form a further configuration of an electroactive actuator 05 with higher force amplification. Each of the uppermost and lowermost stacked piezoelectric elements 10 are crossly arranged and then interconnected at their intersection using four-screwed mounts 60. The four-screwed mounts 60 are made of three elements: a backing-element 64, an output-element 62 and an intermediate-element 63, as shown in FIG. 6. The three elements are assembled so as to sandwich the intersecting piezoelectric elements 10 and then fastened by four screws 65 and nuts 66. This arrangement, in which the piezoelectric elements of a pair (or more) of electroactive actuators 01 intersect, will efficiently improve the actuating force of the mechanism.

Figure 7:
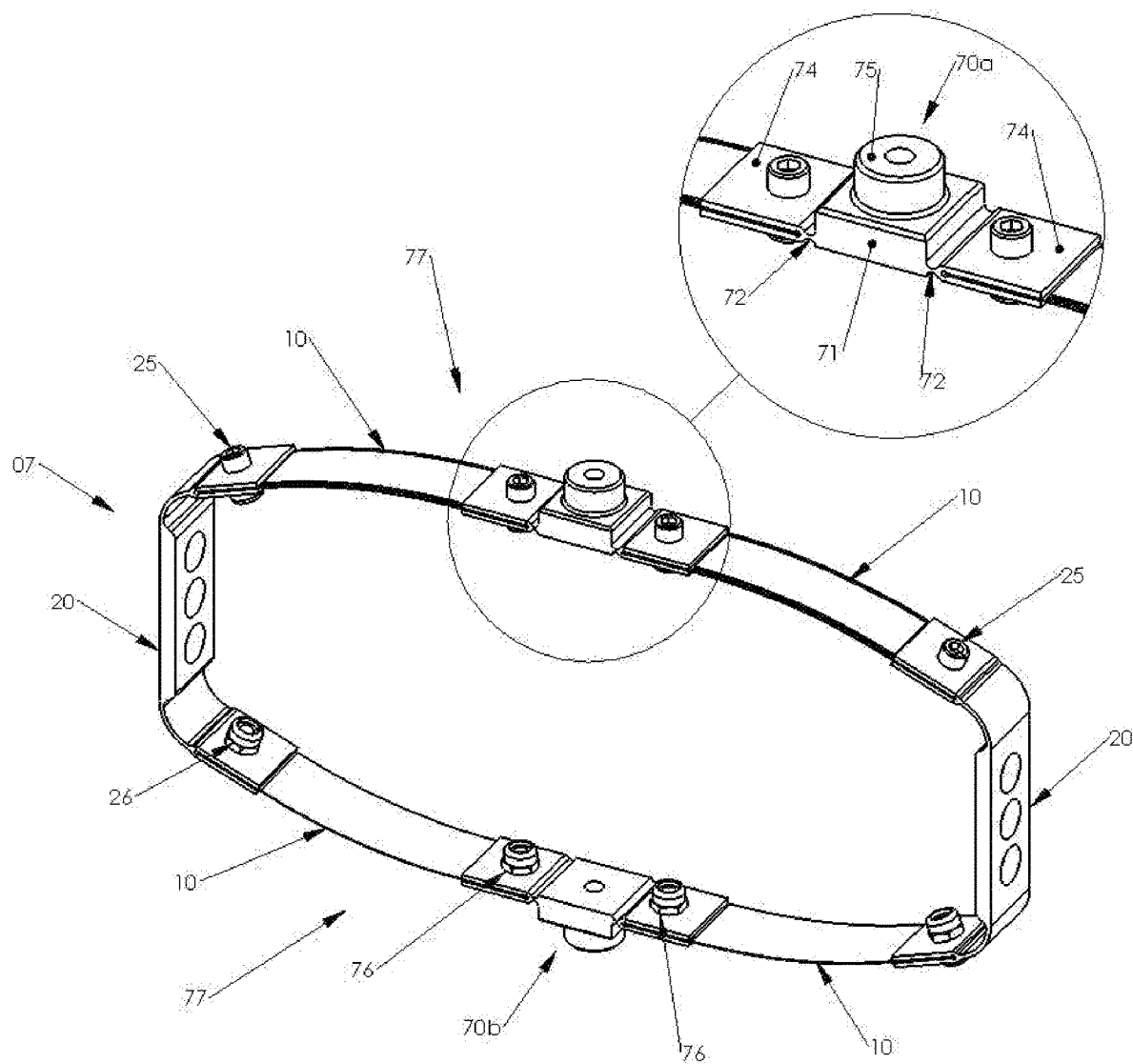
FIG. 7 schematically shows a perspective view of a further embodiment of an electroactive actuator device using two pairs of piezoelectric elements attached by two support mechanisms.

Referring now to FIG. 7, this mechanism illustrates an embodiment of a pair (uppermost and lowermost) of paired piezoelectric elements 77 coupled by means of two support mechanisms 20 so that they face each other to form a further electroactive actuator 07 having the advantages of amplifying the actuating displacement. The paired piezoelectric element 77 comprises two piezoelectric elements 10 linked end-to-end via a double-gripper mount 70, which includes a connector 75, a rigid link 71, and two grippers 74. The connector 75, which is mounted on the outer face of the rigid link 71, has a tapped hole in the center for attaching the actuator to other systems. The two grippers 74 are connected to the two opposite sides of the rigid link 71 via elastically flexible joints 72. Each one of the piezoelectric elements 10 is held by one of these grippers 74 at the tab portion 12 using a gripping mechanism. As a result, each pair of linked piezoelectric elements 10 acts as a single lengthy curved piezoelectric element 77 with a high dynamic response at the connecting point (double-gripper mount 70).

Figure 8:
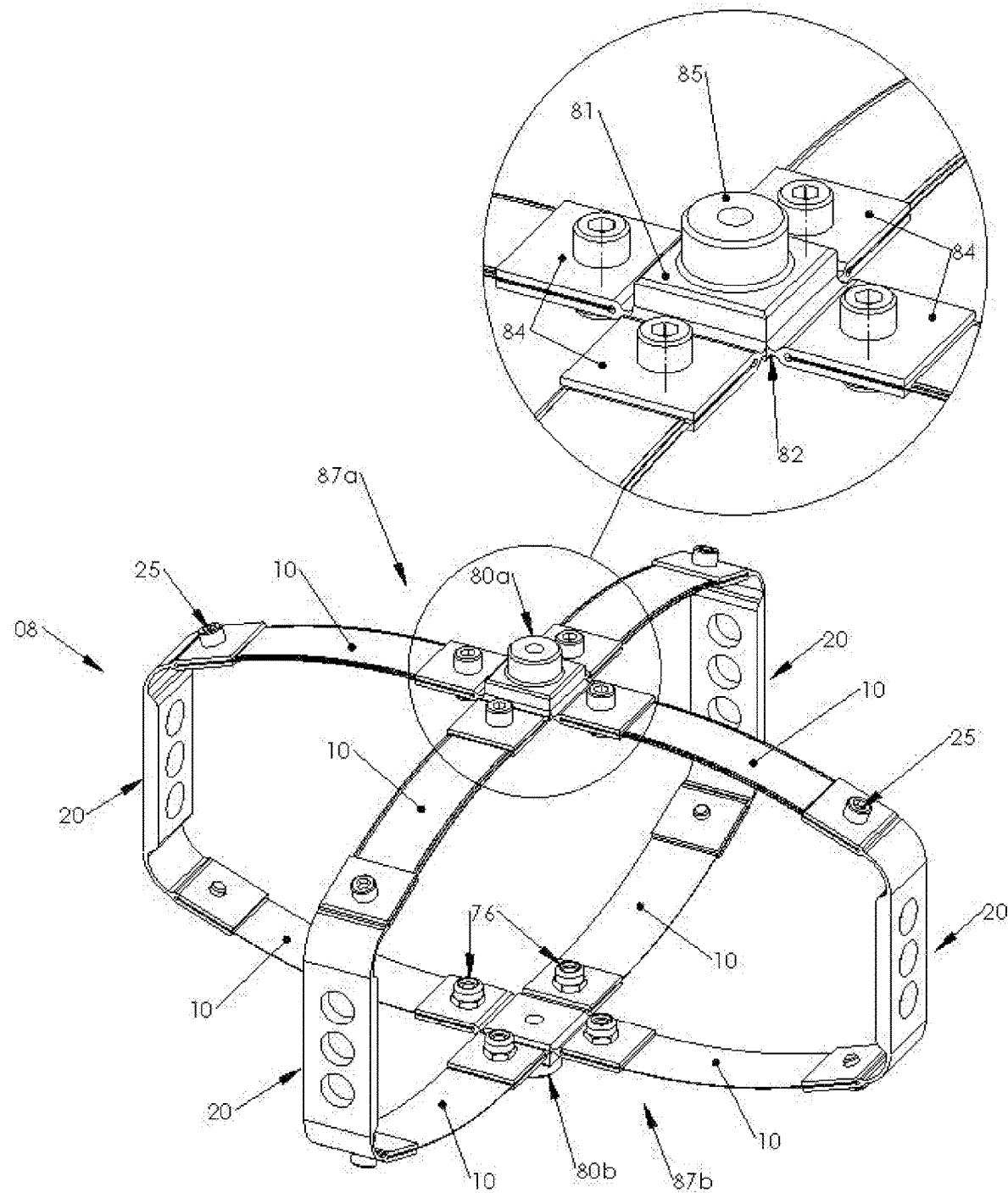
FIG. 8 schematically shows a perspective view of a further embodiment of an electroactive actuator device using two groups of four piezoelectric elements attached by four support mechanisms.

Referring now to FIG. 8, the figure shows a further embodiment of a pair (uppermost and lowermost) of a group of four piezoelectric elements 87 attached to four support mechanisms 20 to form an advanced actuator 08 with higher output of electromechanical work. The group of four piezoelectric elements 87 is constructed of four piezoelectric elements 10, in which their tabs 12 are connected to a quadruple-gripper mount 80. Similarly, the quadruple-gripper mount 80 consists of a connector 85, rigid link 81 and four grippers 84. However, the four grippers 84 are connected to the four sides of the rigid link 81 by elastically flexible joints 82. The gripping mechanism of each gripper 84 grips one of the piezoelectric elements 10 at its tab 12, while the other tab 12 is grasped by one of the support mechanisms 20 at the grippers 24. Thus, four support mechanisms 20 are utilized to couple the uppermost and lowermost group of four piezoelectric elements 87. This embodiment of an electroactive actuator presents an advanced actuator design with the ability to provide higher actuating force and displacement.

The above embodiments describe different arrangements of pluralities of electroactive actuators 01 and piezoelectric elements 10 to form further electroactive mechanisms that can generate improved electromechanical motions, but with single degrees of freedom. However, a mechanism with multiple degrees of freedom is achieved by means of three or more electroactive actuators arranged in symmetrical groups of three or more elements.

Figure 9:
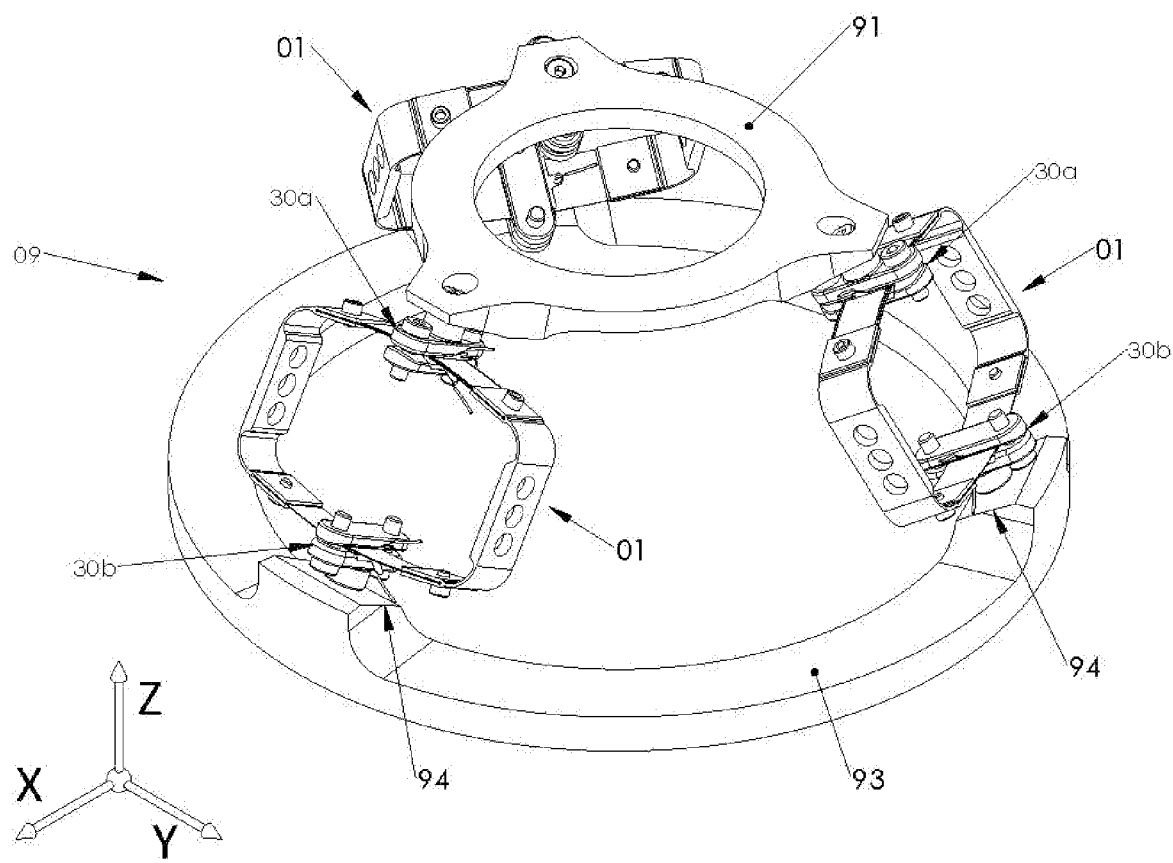
FIG. 9 schematically shows a perspective view of a parallel platform mechanism with five degrees of freedom constructed by means of three electroactive actuator devices arranged as a tripod, according to a further embodiment of the invention.

With referring to FIG. 9, three electroactive actuators 01 may be arranged as a tripod to form a parallel platform 09 with five degrees of freedom—three degrees of translation and two degrees of rotation. The geometry of the 5-DOF parallel platform basically consists of a fixed base 93 and a movable platform 91 attached to each other via three electroactive actuators 01, which represent the active links of the mechanism. The electroactive actuators 01 are connected to the fixed base 93 through the lowermost electrical-mechanical connectors 30b mounted on inclined faces 94, and to the movable platform 91 by the uppermost electrical-mechanical connectors 30a, as shown in FIG. 9.

When the three electroactive actuators 01 are electrically loaded with different voltages, the electroactive actuators 01 unequally deform, resulting in different lengths between the connecting points. As a result, the position and orientation of the movable platform 91 with respect to the fixed base 93 are changed responsively. This design of actuator arrangements has the advantage of providing improved dynamic motion, high accuracy positioning, great load-carrying capability and stiffness. Due to these advantages, this 5-DOF parallel platform device 09 can be efficiently used in the optics, flight applications, high-precision positioning systems, vibration isolation and micro-machining centers, among other uses.

The foregoing is considered as illustrative only of the principles of the invention.

Further, since numerous modifications and changes will readily occur to those skilled in the art, it is not desired to limit the invention to the exact construction and operation shown and described, and accordingly, all suitable modifications and equivalents may be resorted to, falling within the scope of the invention.

With respect to the above description, it is to be realized that the optimum relationships for the parts of the invention in regard to size, shape, form, materials, function and manner of operation, assembly and use are deemed readily apparent and obvious to those skilled in the art, and all equivalent relationships to those illustrated in the drawings and described in the specification are intended to be encompassed by the present invention.

What is claimed is:

1. An electroactive actuator device comprising,
a) a pair of electroactive actuator elements comprising of either a unimorph or a bimorph curved-beam configuration, wherein each said electroactive actuator element comprises a set of inactive layers bonded to or sandwiched by a set of electrically active layers to be used as an electroactive energy source, wherein said pair of electroactive actuator elements arranged opposite to each other with an outward convexity;
b) a pair of C-shaped support members coupling said pair of electroactive actuator elements, wherein each said support member comprises of:
 i) a rigid linkage having a distal end and a proximal end;
 ii) a first and a second elastically fixable hinges attached to said rigid linkage from said distal and proximal ends;
 iii) a first and a second grippers with a gripping mechanism connected to said first and second elastically fixable hinges and engaged with said pair of electroactive actuator elements;
iv) a pair of electrical-mechanical connector electrically connecting said pair of electroactive actuator elements with a voltage supply and mechanically connecting said electroactive actuator device to an external mechanism,
v) wherein each said electrical-mechanical connector comprises of:
 i) an electrical member comprising a pair of film conductors bonded to each said electroactive actuator element;
 ii) a mechanical member comprising of non-conductive materials arranged to sandwich each said electroactive actuator element, and,
whereby said pair of electroactive actuator elements bend subject to an electrical voltage in which said electroactive actuator elements become more curved and said fixable hinges become less curved, thereby the centers of said electroactive actuator elements outwardly move away from their initial positions, pushing said electrical-mechanical connectors away from each other, while said linkages inwardly transfer in a horizontal direction from their initial positions.

2. The electroactive actuator device of claim 1, wherein said electroactive actuator device is a closed shaped device.

3. The electroactive actuator device of claim 1, wherein each said electroactive actuator element is a pre-stressed unimorph actuator in the form of a dome with a convex side and a concave side.

4. The electroactive actuator device of claim 3, wherein said pre-stressed unimorph actuator comprises of one active layer of electroactive material sandwiched by a pair of electrodes, in which one electrode is bounded on said convex side, and the other electrode is bounded on said concave side.

5. The electroactive actuator device of claim 4, wherein said pre-stressed unimorph actuator comprises of one active portion composed of an active layer and an inactive layer, placed at a center of said electroactive actuator element, and two passive inactive tabs placed at a first end and a second end of said electroactive actuator element.

6. The electroactive actuator device of claim 1, wherein each said active layer comprises of a patch of electroactive material comprising a piezoelectric material and an electrostrictive material.

7. The electroactive actuator device of claim 1, wherein said inactive layer being selected from the group consisting of metallic material, plastic material, fiberglass composite, carbon-fiber composite, cermet or ceramic.

8. The electroactive actuator device of claim 1, wherein C-shaped support members being selected from the group consisting of metallic material, plastic material, fiberglass composite, carbon-fiber composite, cermet or ceramic.

9. The electroactive actuator device of claim 1, wherein increase and decrease of a thickness of a cross-section of said flexible hinge change an amplification of said electroactive actuator device.

10. The electroactive actuator device of claim 1, wherein said rigid linkage comprises of a solid flat bar of a rectangular cross-section having a plurality of apertures to reduce a weight of said electroactive actuator device.

11. The electroactive actuator device of claim 1, wherein a thickness of said flexible hinge is less than a thickness of said rigid linkage and wherein a bending flexibility of said flexible hinge is higher than a bending flexibility of said rigid linkage.

12. The electroactive actuator device of claim 11, wherein said thickness of said flexible hinge is about 1 mm or less and said thickness of said rigid linkage is about 3 mm.

13. The electroactive actuator device of claim 1, wherein each said gripper is has an inclined angle with respect to a horizontal axis, and wherein an angle between said gripper and said rigid linkage is greater than 90°.

14. The electroactive actuator device of claim 1, wherein each said electrical-mechanical connector further comprises of an output-element and a backing-element centrally sandwiching said electroactive actuator element, wherein said output-element is mounted on a convex face of the electrical-mechanical connector and said backing-element is mounted on a concave face of the electrical-mechanical connector.

15. The electroactive actuator device of claim 1, wherein a plurality of said electroactive actuator devices is arranged in parallel to each other within a housing to integrate a united output electromechanical response.

16. The electroactive actuator device of claim 1, wherein a plurality of said electroactive actuator devices is arranged in series within a housing to integrate the summation of an output electromechanical response of all said electroactive actuator devices.

17. The electroactive actuator device of claim 1, wherein said electroactive actuator device provides a piston motion with one degree of freedom and with high stroke displacement.

18. The electroactive actuator device of claim 1, wherein a pair of said electroactive actuator elements interconnected at said centers to provide higher electromechanical force.

19. The electroactive actuator device of claim 1, wherein said device comprises of at least two electroactive actuator elements which radially arranged and attached to each other by a gripping mechanism.

20. The electroactive actuator device of claim 1, wherein at least three said electroactive actuator devices actively linking a movable platform with a fixed base to provide a multi-degree-of-freedom parallel platform mechanism.

* * * * *